(12) United States Patent
Toyonaka et al.

(10) Patent No.: US 8,575,714 B2
(45) Date of Patent: Nov. 5, 2013

(54) BACKSIDE ILLUMINATED SEMICONDUCTOR LIGHT-RECEIVING DEVICE, OPTICAL RECEIVER MODULE, AND OPTICAL TRANSCEIVER

(75) Inventors: Takashi Toyonaka, Yokohama (JP); Hiroshi Hamada, Yokohama (JP); Masataka Yokosawa, Kawasaki (JP)

(73) Assignee: Oclaro Japan, Inc., Kanagawa (JP)

( * ) Notice: Subject to any disclaimer, the term of this patent is extended or adjusted under 35 U.S.C. 154(b) by 383 days.

(21) Appl. No.: 13/085,604

(22) Filed: Apr. 13, 2011

(65) Prior Publication Data
US 2011/0286083 A1 Nov. 24, 2011

(30) Foreign Application Priority Data

May 18, 2010 (JP) .................. 2010-114313
Mar. 8, 2011 (JP) .................. 2011-050848

(51) Int. Cl.
*H01L 31/00* (2006.01)
(52) U.S. Cl.
USPC .................. 257/460; 257/228; 257/E33.045; 438/160
(58) Field of Classification Search
USPC ............ 257/460, 179, 185, 79, 228, E33.045; 438/160
See application file for complete search history.

(56) References Cited

U.S. PATENT DOCUMENTS

| 6,690,079 | B2 * | 2/2004 | Fujimura et al. | 257/460 |
| 7,719,028 | B2 * | 5/2010 | Yagyu et al. | 257/184 |
| 8,039,918 | B2 * | 10/2011 | Nakata | 257/466 |
| 2004/0056179 | A1 * | 3/2004 | Wang et al. | 250/214.1 |

FOREIGN PATENT DOCUMENTS

JP 2000-349113 A 12/2000

* cited by examiner

*Primary Examiner* — Jarrett Stark
*Assistant Examiner* — Shahed Ahmed
(74) *Attorney, Agent, or Firm* — Mattingly & Malur, PC

(57) ABSTRACT

Provided is a backside illuminated semiconductor light-receiving device enhancing a frequency characteristic without deteriorating assembling operability. The light-receiving device includes a rectangular substrate; a light receiving mesa portion formed on a center portion of one side on a front surface of the substrate and includes a PN junction portion; a P-type electrode formed on the light receiving mesa portion and conductive with one side of the PN junction portion; an N-type electrode mesa portion formed on one corner portion of the one side; an N-type electrode pulled out to the N-type electrode mesa portion and conductive with the other side of the PN junction portion; a P-type electrode mesa portion and a dummy electrode mesa portion formed in a region including three other corner portions; and a dummy electrode formed on the dummy electrode mesa portion.

8 Claims, 8 Drawing Sheets

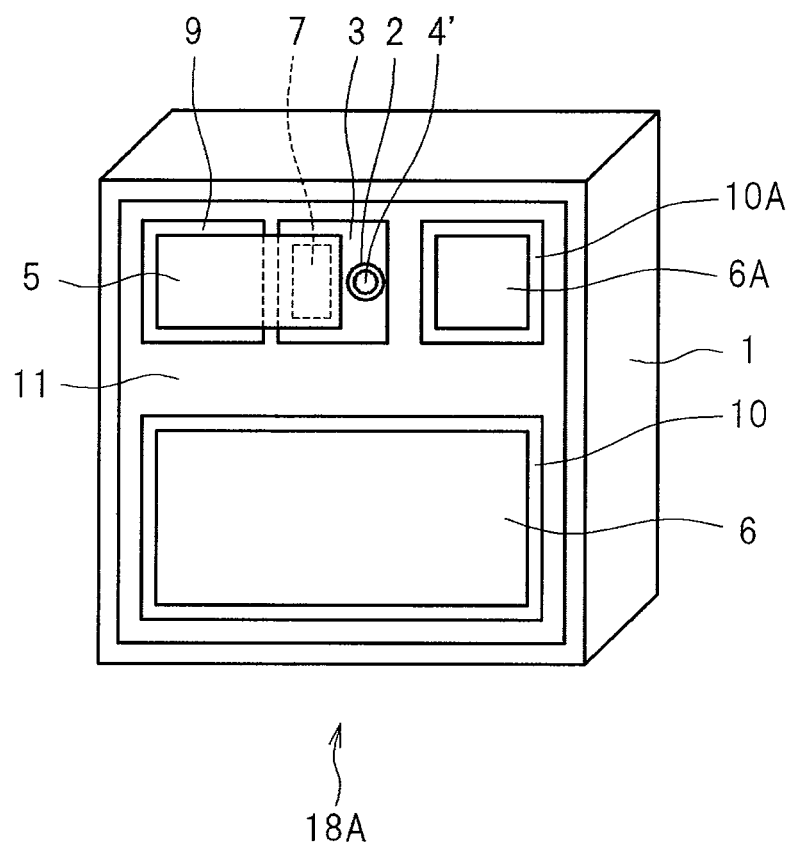

BACKSIDE ILLUMINATED SEMICONDUCTOR LIGHT-RECEIVING DEVICE, OPTICAL RECEIVER MODULE, AND OPTICAL TRANSCEIVER

CROSS-REFERENCE TO RELATED APPLICATIONS

The present application claims priority from Japanese patent applications JP2010-114313 filed on May 18, 2010 and JP2011-050848 filed on Mar. 8, 2011, the contents of which are hereby incorporated by reference into this application.

BACKGROUND OF THE INVENTION

1. Field of the Invention

The present invention relates to a backside illuminated semiconductor light-receiving device, an optical receiver module which incorporates the backside illuminated semiconductor light-receiving device therein, and an optical transceiver which incorporates the backside illuminated semiconductor light-receiving device therein.

2. Description of the Related Art

The backside illuminated semiconductor light-receiving device is a photoelectric conversion element which includes a semiconductor substrate and a light receiving part which is formed on a front surface of the semiconductor substrate, and receives light incident from a back surface of the semiconductor substrate by the light receiving part.

In general, a backside illuminated semiconductor light-receiving device is, for facilitating the reception of light incident from a back surface of a semiconductor substrate, mounted on a ceramic-made carrier, for example, in an upside-down manner such that the back surface faces upward and a front surface faces downward. To be more specific, an electrode of a first conductive type (for example, a P-type electrode) and an electrode of a second conductive type (for example, an N-type electrode) are connected to two electrodes formed on the front surface of the carrier respectively by soldering. Here, the electrode of the first conductive type is made conductive with one side of a PN junction portion which is formed on an upper surface of a light receiving mesa portion, and the electrode of the second conductive type is pulled out to an upper surface of a mesa portion and is made conductive with the other side of the PN junction portion which is formed in a region on a front surface of the substrate different from a region where the light receiving mesa portion.

However, usually, an upper surface of the light receiving mesa portion on which the electrode of a first conductive type is formed has a narrower area compared to an upper surface of a pedestal on which the pull-out electrode of a second conductive type is formed and hence, there exists a possibility that the light receiving mesa portion is broken due to a pressure concentrating on the upper surface side of the light receiving mesa portion.

To cope with such a drawback, JP 2000-349113 A discloses a semiconductor light-receiving device having the structure where on a side opposite to a mesa portion on which an electrode of a second conductive type is formed, a mesa portion having the same shape as the former mesa portion is formed with a light receiving mesa portion (operation region) sandwiched between the mesa portions. Due to such structure, a pressure applied to the upper surface of the light receiving mesa portion when the semiconductor light-receiving device is mounted on a printed circuit board or the like by thermo compression bonding can be reduced whereby breaking of the light receiving mesa portion or the insufficient adhesion of the device can be prevented.

SUMMARY OF THE INVENTION

However, in the semiconductor light-receiving device disclosed in JP 2000-349113 A, three mesa portions are formed in a row on a center portion of a landscape-shaped semiconductor substrate along the lengthwise direction of the substrate. Accordingly, handling of the semiconductor light-receiving device is difficult. For example, in mounting the light-receiving device having such structure on a carrier, a warp is liable to occur in the breathwise direction (perpendicular to the lengthwise direction) when the light-receiving device is adhered by vacuum using a collet thus remarkably lowering assembling operability.

However, although the mere approximation of an aspect ratio of the semiconductor substrate to 1:1 (the approximation of a shape of the semiconductor substrate to a square) makes the handling of the light-receiving device easy, a length of a connection line from a PN junction portion to a connection terminal of a pre-amplifier is elongated when the semiconductor light-receiving device is mounted in an optical receiver module, a frequency characteristic of the optical transmitter module is deteriorated.

FIG. 6 is a view showing a backside illuminated semiconductor light-receiving device 40 which is mounted in an optical transmitter module, and constitutes one example of a backside illuminated semiconductor light-receiving device having a square substrate. As shown in FIG. 6, when a shape of a semiconductor substrate 41 of the backside illuminated semiconductor light-receiving device 40 is formed into a shape close to a square so as to make handling of the light-receiving device easy, by longitudinally elongating shapes of mesa portions 43, 44 formed on both sides of a light receiving mesa portion 42 corresponding to the shape of the semiconductor substrate 41, a pressure applied to an upper surface of the light-receiving mesa portion 42 can be reduced. However, a length of a line which connects a signal-voltage electrode formed on an upper surface of the light receiving mesa portion 42 formed on a center portion of the semiconductor substrate 41 and a signal-voltage terminal 49 of a pre-amplifier 48 (a signal-voltage film-like line 46 formed on a sub mount 45 and a pattern connection wire 50) is elongated. Further, a length of a line which connects a pull-out electrode formed on an upper surface of the mesa portion 43 and a bias power source electrode 51 (a bias-voltage film-like line 47 formed on the sub mount 45 and a pattern connection wire 52) is slightly elongated. Accordingly, a frequency characteristic of a light transmitter module is deteriorated.

The present invention has been made to overcome such drawbacks, and it is an object of the present invention to provide a backside illuminated semiconductor light-receiving device which can enhance a frequency characteristic without deteriorating assembling operability, an optical receiver module which incorporates the backside illuminated semiconductor light-receiving device therein, and an optical transceiver which incorporates the backside illuminated semiconductor light-receiving device therein.

To overcome the above-mentioned drawbacks, according to a first aspect of the present invention, there is provided a backside illuminated semiconductor light-receiving device which includes: a rectangular semiconductor substrate; a mesa-shaped light receiving portion having a PN junction portion which receives light incident from a back surface of the semiconductor substrate, the light receiving portion being formed on a center portion of one side on a front surface of the semiconductor substrate and at a position where a distance from the one side to the light receiving portion is set shorter than ½ of a length of two other sides adjacent to the one side; an electrode of a first conductive type which is formed on an upper surface of the light receiving portion and is conductive with one side of the PN junction portion; a main mesa portion which is formed on one corner portion of the one side on the front surface of the semiconductor substrate, and has an upper surface wider than the upper surface of the light receiving portion; an electrode of a second conductive type which is pulled out to the upper surface of the main mesa portion and is conductive with the other side of the PN junction portion; one or a plurality of sub mesa portions which are formed in a region which includes three other corner portions on the front surface of the semiconductor substrate and have upper surfaces wider than the upper surface of the light receiving portion; and an electrode formed on the upper surface of each sub mesa portion.

The light-receiving device may be configured such that a distance from the center of the light receiving portion to the one side is set to 0.1 mm or less.

The light-receiving device may be configured such that a height of the main mesa portion and a height of the sub mesa portions are set higher than a height of the light receiving portion.

The light-receiving device may be configured such that in a state where the plurality of sub mesa portions may be formed in the region which includes three other corner portions on the front surface of the semiconductor substrate, one of the plurality of sub mesa portions is formed on the other corner portion of the one side on the front surface of the semiconductor substrate, the electrode of the first conductive type may be pulled out to the upper surface of the sub mesa portion, and a dummy electrode which is insulated from the PN junction portion is formed on the upper surface of other sub mesa portions of the plurality of sub mesa portions.

According to a second aspect of the present invention, there is provided an optical receiver module which incorporates a backside illuminated semiconductor light-receiving device therein, the backside illuminated semiconductor light-receiving device including: a rectangular semiconductor substrate; a mesa-shaped light receiving portion having a PN junction portion which receives light incident from a back surface of the semiconductor substrate, the light receiving portion being formed on a center portion of one side on a front surface of the semiconductor substrate and at a position where a distance from the one side to the light receiving portion is set shorter than ½ of a length of two other sides adjacent to the one side; an electrode of a first conductive type which is formed on an upper surface of the light receiving portion and is conductive with one side of the PN junction portion; a main mesa portion which is formed on one corner portion of the one side on the front surface of the semiconductor substrate, and has an upper surface wider than the upper surface of the light receiving portion; an electrode of a second conductive type which is pulled out to the upper surface of the main mesa portion and is conductive with the other side of the PN junction portion; one or a plurality of sub mesa portions which are formed in a region which includes three other corner portions on the front surface of the semiconductor substrate and have upper surfaces wider than the upper surface of the light receiving portion; and an electrode formed on the upper surface of each sub mesa portion.

The optical receiver module may further include: a preamplifier which amplifies an electric signal output of the backside illuminated semiconductor light-receiving device; and a holding member on which a signal-voltage line to which the electrode of the first conductive type is connected, a bias-voltage line to which the electrode of the second conductive type is connected and a line to which the electrode formed on the upper surface of the sub mesa portion is connected are formed, the holding member holding the backside illuminated semiconductor light-receiving device by attaching a front surface side of the backside illuminated semiconductor light-receiving device, wherein an upper surface of the holding member is positioned in the vicinity of the pre-amplifier, and the upper surface of the holding member and an upper surface of the pre-amplifier are substantially equal to each other in height, and a portion of the signal-voltage line which extends to the upper surface of the holding member is connected to a signal-voltage terminal formed on the upper surface of the pre-amplifier through a conductive wire.

The optical receiver module may be configured such that a length of a connection line from the center of the light receiving portion to the signal-voltage terminal is set to 1 mm or less.

According to still another aspect of the present invention, there is provided an optical transceiver provided with the above-mentioned optical receiver module.

The present invention provides a backside illuminated semiconductor light-receiving device which can enhance a frequency characteristic without deteriorating assembling operability, an optical receiver module which incorporates the backside illuminated semiconductor light-receiving device therein, and an optical transceiver which incorporates the backside illuminated semiconductor light-receiving device therein.

BRIEF DESCRIPTION OF THE DRAWINGS

In the accompanying drawings:

FIG. 5A is a perspective view of a backside illuminated semiconductor light-receiving device according to another embodiment of the present invention;

DETAILED DESCRIPTION OF THE INVENTION

Hereinafter, one embodiment of the present invention is explained in detail in conjunction with drawings.

Figure 1:
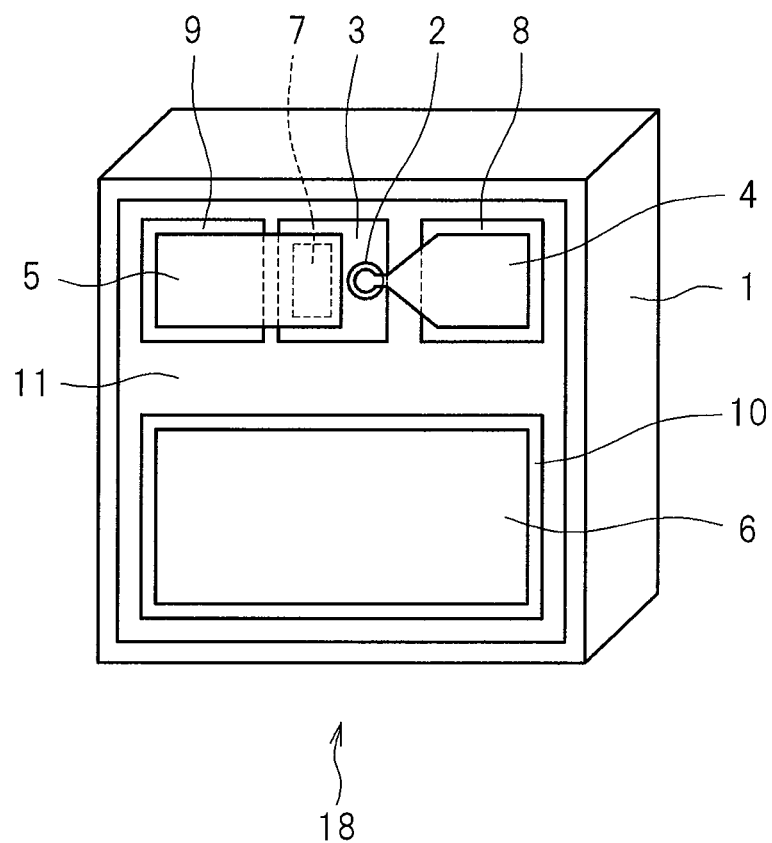
FIG. 1 is a perspective view of a backside illuminated semiconductor light-receiving device according to an embodiment of the present invention.

FIG. 1 is a perspective view of a backside illuminated semiconductor light-receiving device 18 according to this embodiment. The backside illuminated semiconductor light-receiving device 18 and an optical receiver module which incorporates the light-receiving device 18 therein are mounted in a high-speed and broad-band optical receiver which detects a signal transmitting at a high speed such as a transmission speed of 44.6 Gbps, for example.

As shown in FIG. 1, the backside illuminated semiconductor light-receiving device 18 includes a semi-insulating Fe-doped InP substrate 1, a light receiving mesa portion 2, a light receiving region mesa portion 3, a P-type electrode 4, an N-type electrode 5, a dummy electrode 6, a P-type electrode mesa portion 8 (one of sub mesa portions), an N-type electrode mesa portion 9 (main mesa portion), and a dummy electrode mesa portion 10 (one of sub mesa portions).

The Fe-doped InP substrate 1 is a rectangular semiconductor substrate. On a center portion of one side (upper side in this embodiment) on a front surface of the Fe-doped InP substrate 1, the light receiving mesa portion 2 and the light receiving region mesa portion 3 which includes the light receiving mesa portion 2 are formed.

The light receiving mesa portion 2 is a mesa-shaped light receiving portion which includes a PN junction portion which receives light incident from a back surface of the Fe-doped InP substrate 1.

The P-type electrode mesa portion 8 is formed on one corner portion (a right upper corner portion in this embodiment) of the above-mentioned one side (upper side) on the front surface of the Fe-doped InP substrate 1, and the N-type electrode mesa portion 9 is formed on the other corner portion (left upper corner portion in this embodiment) of the above-mentioned one side on the front surface of the Fe-doped InP substrate 1. That is, the N-type electrode mesa portion 9, the light receiving mesa portion 2 (light receiving region mesa portion 3) and the P-type electrode mesa portion 8 are formed on the front surface of the Fe-doped InP substrate 1 along the above-mentioned one side (upper side) of the Fe-doped InP substrate 1.

On an upper surface of the light receiving mesa portion 2, the P-type electrode 4 which is electrically connected with (made conductive with) one side (a P-type contact layer in this embodiment) of the PN junction portion is formed. In this embodiment, the P-type electrode 4 is pulled out to an upper surface of the P-type electrode mesa portion 8 from the upper surface of the light receiving mesa portion 2. Further, the N-type electrode 5 which is electrically connected with the other side (an N-type contact layer in this embodiment) of the PN junction portion of the light receiving mesa portion 2 via a through hole 7 is pulled out to an upper surface of the N-type electrode mesa portion 9.

The front surface of the Fe-doped InP substrate 1 has, different from a landscape shape, a shape where an aspect ratio is approximately 1:1, wherein a length of two other sides (a left side and a right side) which are arranged adjacent to the above-mentioned one side (upper side) is larger than a length of a region which includes the light receiving mesa portion 2 and the N-type electrode mesa portion 9 in the lengthwise direction. That is, main constitutional elements relating to light reception of the backside illuminated semiconductor light-receiving device 18 are formed in a concentrated manner in the vicinity of the above-mentioned one side (upper side) on the front surface of the Fe-doped InP substrate 1. This constitution is adopted for preventing a length of a connection line from the P-type electrode 4 to a signal-voltage terminal formed on a pre-amplifier (described later) from being elongated in a case where the backside illuminated semiconductor light-receiving device 18 is incorporated in the optical receiver module.

To the contrary, in the vicinity of a side (a lower side in this embodiment) which is arranged opposite to the above-mentioned one side (upper side), in a region which includes one corner portion (left lower corner portion) and the other corner portion (right lower corner portion) on the front surface of the Fe-doped InP substrate 1, the dummy electrode mesa portion 10 is formed. The dummy electrode 6 which is electrically independent (insulated) from the PN junction portion of the light receiving mesa portion 2 is formed on an upper surface of the dummy electrode mesa portion 10.

In this manner, according to this embodiment, on the front surface of the Fe-doped InP substrate 1, the P-type electrode mesa portion 8 and the dummy electrode mesa portion 10 constitute sub mesa portions which are formed in a region including three corner portions (the right upper corner portion, the left lower corner portion and the right lower corner portion) while excluding the corner portion where the N-type electrode mesa portion 9 which constitutes a main mesa portion is formed (left upper corner portion).

As shown in FIG. 1, the P-type electrode mesa portion 8, the N-type electrode mesa portion 9 and the dummy electrode mesa portion 10 which are positioned at 4 corner portions on the front surface of the Fe-doped InP substrate 1 have upper surfaces respectively wider than an upper surface of the light receiving mesa portion 2. Due to such a constitution, when the backside illuminated semiconductor light-receiving device 18 is mounted on a holding member arranged in the optical receiver module, a pressure applied to the upper surface of the light receiving mesa portion 2 is dispersed to the upper surface of the main mesa portion and upper surfaces of the sub mesa portions so that breaking of the light receiving mesa portion 2 and the insufficient adhesion of the device can be prevented. Further, heights of the P-type electrode mesa portion 8, the N-type electrode mesa portion 9 and the dummy electrode mesa portion 10 are set equal to or higher than a height of the light receiving mesa portion 2 (approximately equal to the height of the light receiving mesa portion 2 in this embodiment).

Figure 2:
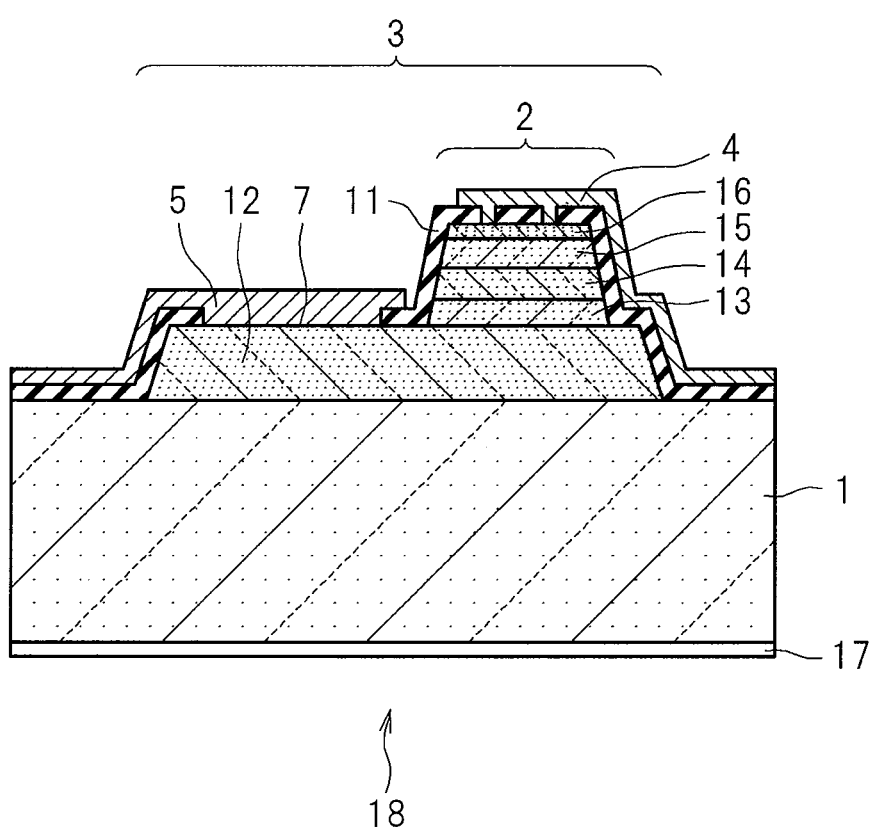
FIG. 2 is a cross-sectional view of a light receiving mesa portion of the backside illuminated semiconductor light-receiving device according to the embodiment of the present invention and the surrounding of the light receiving mesa portion.

Next, one example of the detailed structure of the light receiving mesa portion 2 and the surrounding of the light receiving mesa portion 2 and a manufacturing process is explained in conjunction with FIG. 2. FIG. 2 is a cross-sectional view of the light receiving mesa portion 2 of the backside illuminated semiconductor light-receiving device 18 and the surrounding of the light receiving mesa portion 2. Specific sizes shown in FIG. 2 merely constitute one example.

As shown in FIG. 2, on the semi-insulating Fe-doped InP substrate 1, using a molecular-beam epitaxial growth method, an n-type InP contact layer 12 having a thickness of 1 μm with impurity concentration of $5 \times 10^{18}$ atom/cm$^3$, an n-type InGaAlAs buffer layer 13 having a thickness of 0.5 μm with impurity concentration of $3 \times 10^{17}$ atom/cm$^3$, an n-type InGaAs light absorption layer 14 having a thickness of 0.8 μm with impurity concentration of $2 \times 10^{15}$ atom/cm$^3$ or less, a p-type InGaAlAs buffer layer 15 having a thickness of 0.5 μm with impurity concentration of $3 \times 10^{17}$ atom/cm$^3$, and a p-type InGaAs contact layer 16 having a thickness of 0.1 μm with impurity concentration of $5 \times 10^{19}$ atom/cm$^3$ are formed in order.

Then, a patterning mask made of an oxide film is formed on an upper portion of the p-type InGaAs contact layer 16. Using the patterning mask as a mask, the p-type InGaAs contact layer 16, the p-type InGaAlAs buffer layer 15, the n-type InGaAs light absorption layer 14, the n-type InGaAlAs buffer layer 13, the n-type InP contact layer 12 and a portion of the Fe-doped InP substrate 1 are etched by a non-selective Br-based etchant thus forming the light receiving region mesa portion 3 which includes the light receiving mesa portion 2, the P-type electrode mesa portion 8, the N-type electrode mesa portion 9 and the dummy electrode mesa portion 10. The P-type electrode mesa portion 8 and the N-type electrode mesa portion 9 have a square shape where both longitudinal and lateral sizes are 50 μm, and the dummy electrode mesa portion 10 has a rectangular shape, where a longitudinal size is 110 μm and a lateral size is 220 μm.

Next, on a certain region where the light receiving mesa portion 2 is formed, out of the upper portion of the p-type InGaAs contact layer 16 in the light receiving region mesa portion 3, a circular patterning mask made of an oxide film is formed. Using the circular patterning mask as a mask, the p-type InGaAs contact layer 16, the p-type InGaAlAs buffer layer 15, the n-type InGaAs light absorption layer 14 and the n-type InGaAls buffer layer 13 of the light receiving region mesa portion 3 are etched thus forming the light receiving mesa portion 2. In this etching, a selective etchant having an etching rate to an InGaAlAs-based material sufficiently higher than an etching rate to InP, for example, phosphoric acid-based etchant is used so that etching can be stopped in the vicinity of the frontmost surface of the n-type InP contact layer 12. The light receiving mesa portion 2 has a circular shape with a diameter of 10 μm. A distance between the center of the P-type electrode mesa portion 8 and the center of the light receiving mesa portion 2 is set to 70 μm, and a distance between the center of the N-type electrode mesa portion 9 and the center of the light receiving mesa portion 2 is set to 90 μm.

After removing the circular patterning mask, the whole front surface is covered with an insulating protective film 11. The protective film 11 may be formed of an SiN layer having a thickness of 0.2 μm and an $SiO_2$ layer having a thickness of 0.3 μm, for example. However, the protective film 11 may be formed using other insulating materials. By processing the protective film 11 using a photolithography technique, a portion (through hole 7) of the n-type InP contact layer 12 and a portion of the p-type InGaAs contact layer 16 are exposed thus forming the N-type electrode 5 which is connected to the n-type InP contact layer 12, the P-type electrode 4 which is connected to the p-type InGaAs contact layer 16, and the dummy electrode 6. These electrodes are formed by patterning a Ti/Pt/Au film having a film thickness of 0.5 μm which is deposited by a vapor deposition method using a photolithography technique. (In this specification, "/" in the Ti/Pt/Au film indicates that a Ti layer, a Pt layer and an Au layer are arranged in order from a side near the substrate to a side away from the substrate.) The through hole formed in the p-type InGaAs contact layer 16 has a ring shape formed of two concentric circles. As a result, except for a ring-shaped through hole portion, the optically transparent protective film 11 is formed on the p-type InGaAs contact layer 16, and the Ti/Pt/Au film is formed as a metalized layer thus forming a mirror.

Next, on a back surface of the Fe-doped InP substrate 1, that is, on a lower surface of the Fe-doped InP substrate 1 in FIG. 2, a reflection prevention film 17 made of an SiN film having a thickness of 0.2 μm is formed by coating thus completing a wafer.

Finally, the wafer is divided into plural devices, and one divided device is shown in FIG. 1. To explain a size of the device, both longitudinal and lateral sizes are 0.3 mm, and a thickness is 0.12 mm. The center of the P-type electrode mesa portion 8, the center of the light receiving mesa portion 2 and the center of the N-type electrode mesa portion 9 are positioned at a distance of 0.05 mm from an outer periphery. From a viewpoint of handling, usually, with respect to a size of the device, a length of one side is 0.2 mm or more. When the center of the light receiving mesa portion 2 is arranged at the center of the device, the distance from the outer periphery becomes 0.1 mm or more. However, the center of the light receiving mesa portion 2 is arranged closer to the outer periphery (upper side) than the center of the device. That is, the center of the light receiving mesa portion 2 is desirably arranged at a position where the distance between the center of the light receiving mesa portion 2 and the outer periphery is shorter than ½ of a length of the left side or the right side. In the above-mentioned embodiment, the center of the light receiving mesa portion 2 is positioned at a distance of 0.05 mm from the outer periphery (upper side). According to experiments which inventors of the present invention have carried out, it is confirmed that the distance is not limited to 0.05 mm, and the device can acquire sufficient characteristics by setting the distance within a range of not more than 0.1 mm.

Figure 3:
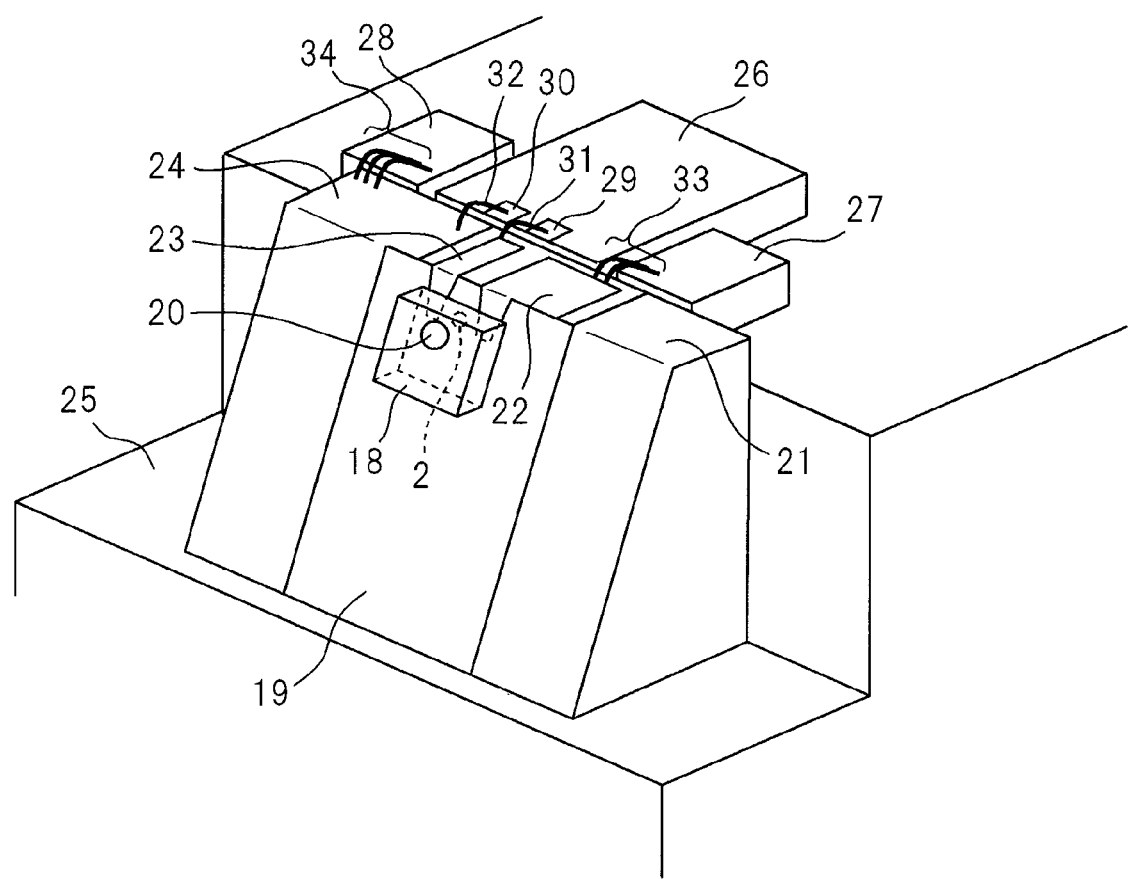
FIG. 3 is a perspective view of a main part of an optical receiver module according to the embodiment of the present invention.

FIG. 3 is a perspective view of a main part of the optical receiver module which incorporates the backside illuminated semiconductor light-receiving device 18 therein. The backside illuminated semiconductor light-receiving device 18 is mounted on a wedge-shaped sub mount 19 made of aluminum nitride (a holding member which holds the backside illuminated semiconductor light-receiving device 18 by attaching a front surface side of the light-receiving device 18), and the sub mount 19 is mounted on a stepped portion of a platform portion 25. Further, The backside illuminated semiconductor light-receiving device 18 has a light-receiving part 20. In this specification, a surface on which the backside illuminated semiconductor light-receiving device 18 is mounted is defined as a front surface of the sub mount 19, a surface which is arranged opposite to the front surface is defined as a back surface of the sub mount 19, a surface which is connected to the stepped portion of the platform portion 25 and has a large width is defined as a bottom surface of the sub mount 19, and a surface which is arranged opposite to the bottom surface and has a small width is defined as an upper surface of the sub mount 19. The sub mount 19 has a lengthwise width of 2 mm and a height of 1.1 mm, the bottom surface has a width of 0.8 mm, and the upper surface has a width of 0.55 mm.

On portions of the upper surface and portions of the front surface of the sub mount 19, a right reference-voltage film-like line 21, a bias-voltage film-like line 22, a signal-voltage film-like line 23, and a left reference-voltage film-like line 24 all of which are made of Ti/Pt/Au films are formed. A Ti/Pt/Au film is formed on the whole bottom surface of the sub mount 19, and the Ti/Pt/Au film is electrically connected with the right reference-voltage film-like line 21 and the left reference-voltage film-like line 24. On the front surface of the sub mount 19, an AuSn solder vapor deposition pattern is formed at one end of the signal-voltage film-like line 23 in conformity with a size of the P-type electrode 4 of the backside illuminated semiconductor light-receiving device 18, and an AuSn solder vapor deposition pattern is formed at one end of the bias-voltage film-like line 22 in conformity with a size of the N-type electrode 5 of the backside illuminated semiconductor light-receiving device 18. The centers of these AuSn solder vapor-deposition patterns are positioned at a distance of 0.23 mm from an upper edge of the front surface of the sub mount 19. Independently from these patterns, an AuSn solder vapor deposition pattern is formed in conformity with a size of the dummy electrode 6. By simultaneously connecting electrodes by soldering at three portions while applying proper weight and heat, it is possible to mount the backside illuminated semiconductor light-receiving device 18 on the sub mount 19.

The backside illuminated semiconductor light-receiving device 18 can generate carriers by allowing a received light incident from the back surface to be reflected on the mirror and to pass through the p-type InGaAs light absorption layer 14 in two ways and possesses high sensitivity. Further, the p-type InGaAs light absorption layer 14 can be made thin so that a carrier traveling time can be shortened whereby the backside illuminated semiconductor light-receiving device 18 possesses the excellent high speed responsive characteristic.

The result of evaluation carried out in a state where the backside illuminated semiconductor light-receiving device 18 is mounted on the sub mount 19 is explained hereinafter. When a reverse bias voltage of 3V is applied to the device and an optical signal having a wavelength of 1550 nm and intensity of 10 μW is inputted to the backside illuminated semiconductor light-receiving device 18, light reception sensitivity of 0.8 A/W is obtained. A dark current at the reverse bias voltage of 3V is a sufficiently low value, that is, not more than 3 nA at a room temperature and not more than 30 nA at a temperature of 85° C. In a high-temperature reverse bias electric conduction test (200° C., 6V), a dark current after a lapse of 2000 hours is not more than 100 nA at a temperature of 85° C. so that the backside illuminated semiconductor light-receiving device 18 exhibits high reliability. An inter-terminal capacity is 40 fF including a parasitic capacity of the sub mount 19, and a forward resistance is 20Ω.

By applying a reverse bias voltage of 3V to the backside illuminated semiconductor light-receiving device 18 and by inputting an optical signal having a wavelength of 1550 nm and intensity of 10 μW to the backside illuminated semiconductor light-receiving device 18, a frequency response characteristic is measured. The result shows that 3 dB cutoff frequency is not less than 40 GHz and the inband deviation is not more than 1 dB at a temperature of 85° C.

Next, the constitution of a main part of the optical receiver module which incorporates the backside illuminated semiconductor light-receiving device 18 therein is explained in conjunction with FIG. 3. As shown in FIG. 3, the platform portion 25 is made of a conductive material such as metal, and has a step-like portion. The sub mount 19 which mounts the backside illuminated semiconductor light-receiving device 18 on the stepped portion thereof is arranged such that the bottom surface and the back surface of the sub mount 19 are brought into contact with the stepped portion of the platform portion 25. The upper surface of the sub mount 19 is set higher than an upper stage surface of the platform portion 25.

Here, the platform portion 25 is at a reference voltage, and the left reference-voltage film-like line 24 and the right reference-voltage film-like line 21 are electrically connected to the platform portion 25 respectively. When the platform portion 25 is grounded, the reference voltage becomes 0V.

A bias power source electrode 27, a pre-amplifier 26 and a reference voltage electrode 28 are arranged on the upper stage surface of the platform portion 25 in the vicinity of an edge of the stepped portion in order from a right side in the drawing. The pre-amplifier 26 amplifies an electric signal outputted from the backside illuminated semiconductor light-receiving device 18, and a signal-voltage terminal 29 and a reference-voltage terminal 30 are mounted on an upper surface of the pre-amplifier 26. An upper surface portion of the left reference-voltage film-like line 24 is electrically connected with the reference voltage electrode 28 via a pattern-connection wire 34. The upper surface portion of the left reference-voltage film-like line 24 extends in the direction toward the signal-voltage film-like line 23 and reaches an area in the vicinity of the reference-voltage terminal 30, and a distal end portion of the upper surface portion of the left reference-voltage film-like line 24 and the reference-voltage terminal 30 are electrically connected with each other via a pattern-connection wire 32. Further, an upper surface portion of the signal-voltage film-like line 23 is positioned in the vicinity of the signal-voltage terminal 29, and is electrically connected to the signal-voltage terminal 29 via a pattern-connection wire 31. The bias power source electrode 27 is arranged on a lateral side of the pre-amplifier 26, an upper surface portion of the bias-voltage film-like line 22 extends in the direction toward the right reference-voltage film-like line 21 and reaches an area in the vicinity of the bias power source electrode 27, and a distal end portion of the upper surface portion of the bias-voltage film-like line 22 and the bias power source electrode 27 are electrically connected with each other via a pattern-connection wire 33.

Due to the above-mentioned constitution, the signal-voltage film-like line 23 electrically connects the P-type electrode 4 of the backside illuminated semiconductor light-receiving device 18 and the pre-amplifier 26 with each other, and the bias-voltage film-like line 22 electrically connects the N-type electrode 5 of the backside illuminated semiconductor light-receiving device 18 and the bias power source electrode 27 with each other. In the module, besides the sub mount 19 which mounts the above-mentioned backside illuminated semiconductor light-receiving device 18 thereon, the pre-amplifier 26 and the like, optical parts such as lenses (not shown in the drawing), a light-receiving device bias circuit (not shown in the drawing), a light-receiving device bias power source (not shown in the drawing), a relay line (not shown in the drawing) and the like are arranged. An optical fiber is connected to an input side of the module so that when an optical signal is inputted to the optical fiber, the optical signal is received by the backside illuminated semiconductor light-receiving device 18, and the backside illuminated semiconductor light-receiving device 18 can convert the optical signal into an electric signal and outputs the electric signal. An AGC amplifier and the like are also connected to an output side of the module, and an amplified analog signal is converted into a digital signal.

In the backside illuminated semiconductor light-receiving device 18, by arranging the center of the light receiving mesa portion 2 at a distance of 0.05 mm from the outer periphery, the distance between the center of the P-type electrode mesa portion 8 and the center of the light receiving mesa portion 2 is shortened to 0.07 mm. As a result, a length of the connection line from the center of the light receiving mesa portion 2 to the signal-voltage terminal 29 via the P-type electrode 4, the signal-voltage film-like line 23 and the pattern-connection wire 31 are shortened to 1 mm and hence, the parasitic inductance generated by these connection lines can be decreased.

Here, by obtaining parasitic impedance to be decreased with respect to a desired frequency, the length of the connection line from the center of the light receiving mesa portion 2 to the signal-voltage terminal 29 via the P-type electrode 4, the signal-voltage film-like line 23 and the pattern-connection wire 31 can be decided. That is, the S21 characteristic which is one of frequency response characteristics can be obtained by computer simulation with respect to a case where the connection line length L is changed.

Figure 4A:
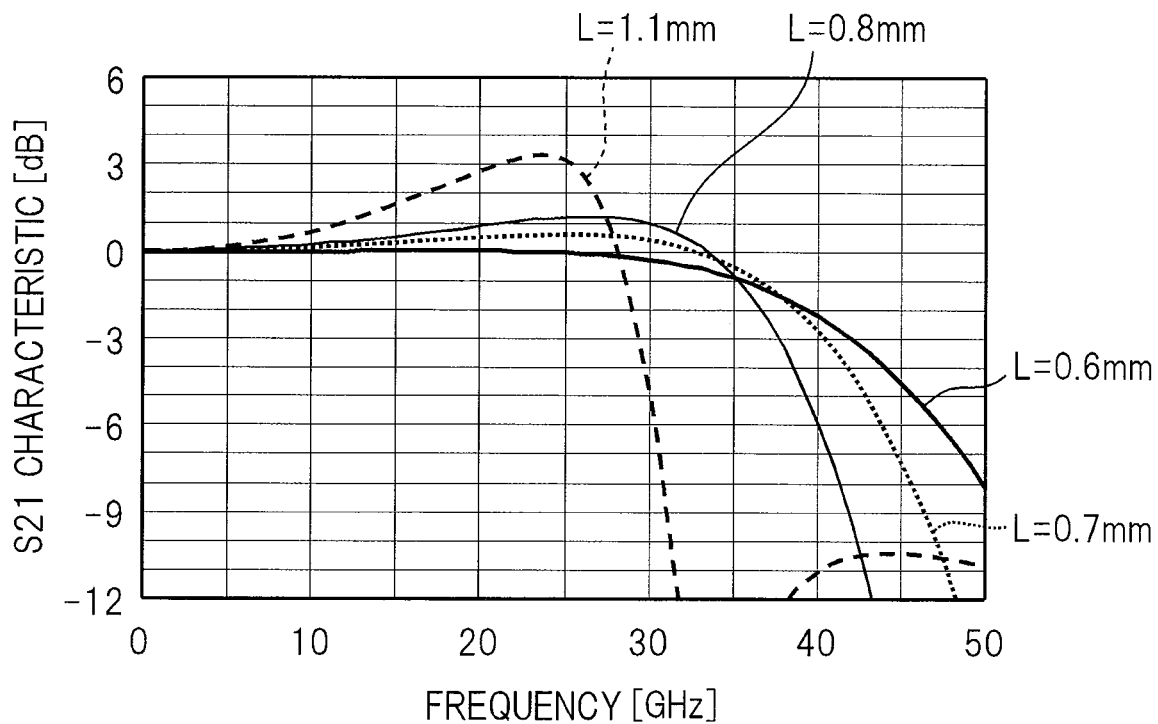
FIG. 4A is a graph showing a result of calculation of a frequency response characteristic of an optical receiver module according to the embodiment of the present invention with respect to a connection line length L.
Figure 4B:
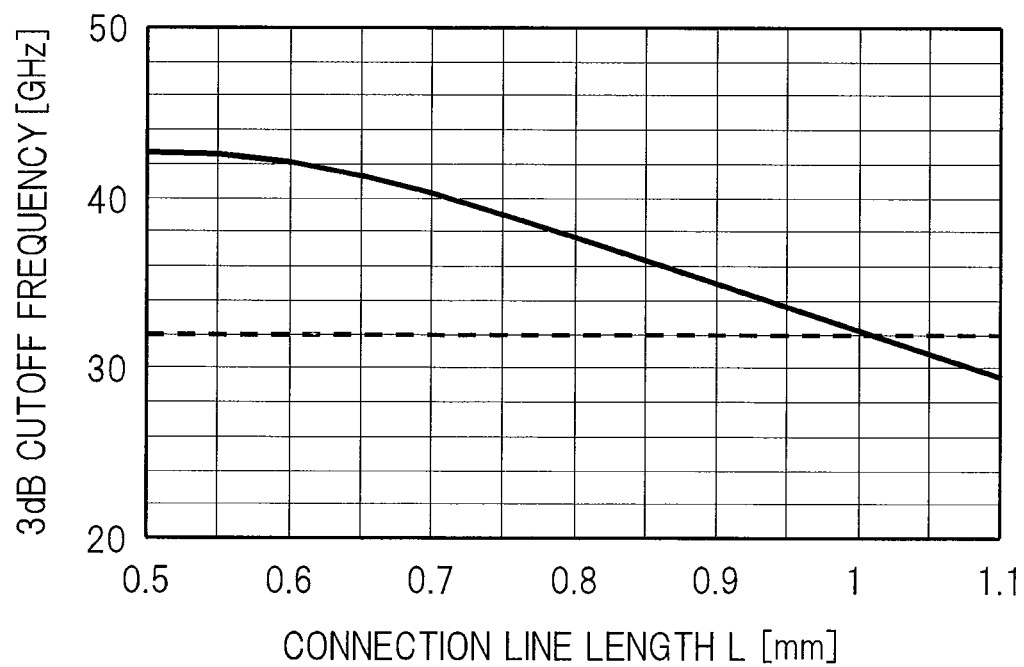
FIG. 4B is a graph showing a result of calculation of 3 dB cutoff frequency of an optical receiver module according to the embodiment of the present invention with respect to the connection line length L.

FIG. 4A is a graph showing a result of calculation of the frequency response characteristic of the optical receiver module which incorporates the backside illuminated semiconductor light-receiving device 18 therein with respect to the connection line length L. FIG. 4A shows the S21 characteristics obtained by calculation with respect to cases where the above-mentioned connection line length L is set to 0.6 mm, 0.7 mm, 0.8 mm and 1.1 mm respectively in the backside illuminated semiconductor light-receiving device 18 and the optical receiver module which incorporates the light-receiving device 18 therein. Here, it is assumed that the forward resistance of the backside illuminated semiconductor light-receiving device 18 is 20Ω, the inter-terminal capacity of the light-receiving device 18 is 40 fF, and the carrier traveling time of the light-receiving device 18 is 14.8 psec. Further, the frequency characteristic of the pre-amplifier is not taken into consideration. FIG. 4B is a graph showing a result of calculation of 3 dB cutoff frequency (f3 dB) of the module with respect to the connection line length L.

Here, assuming that the connection line length L is 1.1 mm, due to the increase of an inductance component attributed to the length L of the signal line, peaking of the S21 characteristic appears in the vicinity of 23 GHz which is a frequency lower than a frequency of a case where the connection line length L is 0.8 to 0.6 mm, and the 3 dB cutoff frequency is approximately 29 GHz. With respect to an optical receiver module for a high-speed and broad-band optical receiver which is requested to satisfy a transmission speed of not less than 40 Gbps, for example, a transmission speed of 44.6 Gbps, it is desirable to set the 3 dB cutoff frequency to not less than 32 GHz which exceeds 70% of the bit rate (44.6 Gbps). In this case, it is necessary to set the connection line length L to not more than 1 mm. In the case of the backside illuminated semiconductor light-receiving device 18 and the optical receiver module which incorporates the light-receiving device 18 therein according to this embodiment, the connection line length L is set to 1 mm so that the intensity of peaking of S21 characteristic is low and the frequency is high whereby the 3 dB cutoff frequency is not less than 32 GHz. Accordingly, the optical receiver module acquires the frequency characteristic which allows the optical receiver module to be used as an optical receiver module for a high-speed and broad-band optical transceiver which transmits a signal at a transmission speed of not less than 44.6 Gbps. When the 3 dB cutoff frequency of the optical receiver module becomes insufficient due to the limitation imposed on the frequency characteristic of the pre-amplifier 26, the connection line length L is further shortened by making a width of the upper surface of the sub mount 19 small and by making distances from the centers of the P-type electrode 4 and the N-type electrode 5 of the backside illuminated semiconductor light-receiving device 18 to the upper edge of the front surface of the sub mount 19 short and hence, the 3 dB cutoff frequency shown in FIG. 4B can be increased whereby it is possible to obtain the desirable 3 dB cutoff frequency for the optical receiver module, for example, 32 GHz. For example, when the 3 dB cutoff frequency of 42 GHz is necessary in the graph shown in FIG. 4B, by shortening the width of the upper surface of the sub mount 19 to a value equal to or more than a minimum width necessary for wire bonding, for example, 0.1 mm, the connection line length L can be set to 0.55 mm so that it is possible to obtain the 3 dB cutoff frequency of 42 GHz.

Further, on the upper surface of the sub mount 19, the signal-voltage film-like line 23 provides, together with the left reference-voltage film-like line 24 and the bias-voltage film-like line 22 positioned on both sides of the signal-voltage film-like line 23, the structure similar to a coplanar transmission line which is one of high frequency transmission lines. Accordingly, the sub mount 19 can be designed such that patterns of the respective film-like lines are optimized so that impedance matching is secured between the respective film-like lines and the pre-amplifier 26 arranged on a succeeding stage from a viewpoint of a high frequency transmission line.

According to the backside illuminated semiconductor light-receiving device 18 and the optical receiver module which incorporates the backside illuminated semiconductor light-receiving device 18 therein explained heretofore, the frequency characteristic can be enhanced without deteriorating assembling operability. Further, it is possible to provide the optical receiver module which exhibits a sufficient responsive characteristic to a high transmission speed even when a light-receiving device including a parasitic device is used, and realizes impedance matching with the pre-amplifier on a succeeding stage.

The present invention is not limited to the above-mentioned embodiment.

Figure 5B:
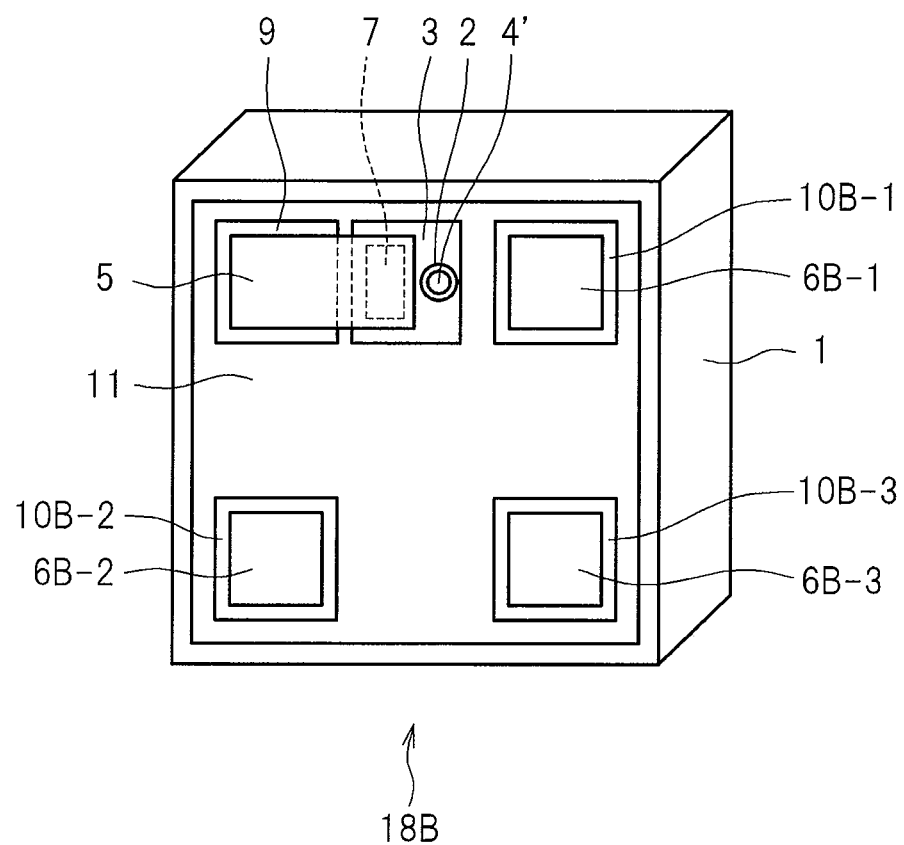
FIG. 5B is a perspective view of a backside illuminated semiconductor light-receiving device according to still another embodiment of the present invention.
Figure 5C:
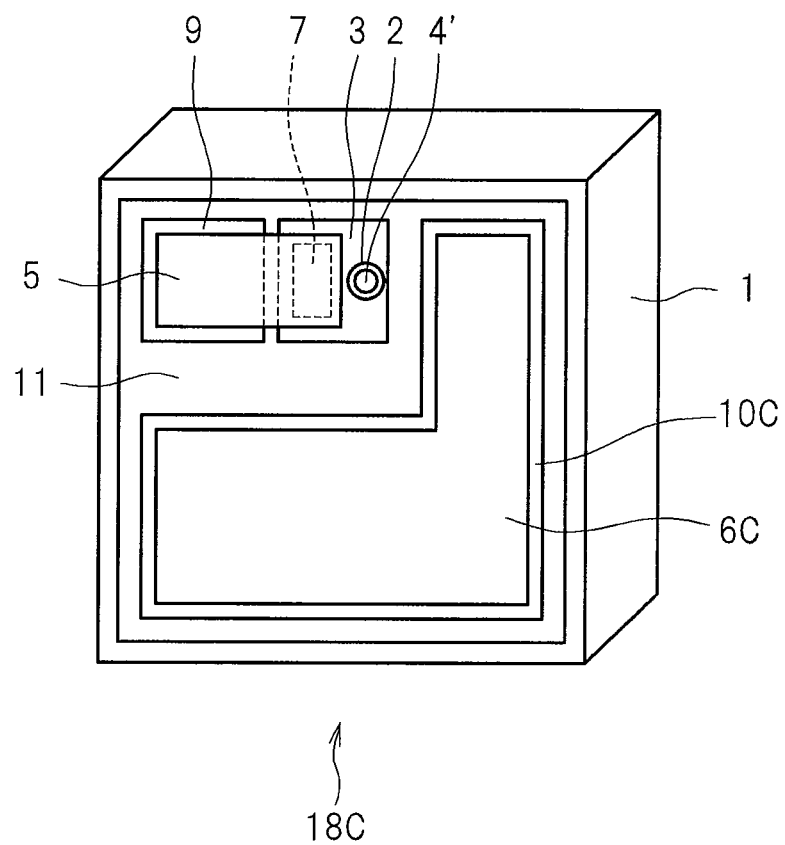
FIG. 5C is a perspective view of a backside illuminated semiconductor light-receiving device according to still another embodiment of the present invention.
Figure 6:
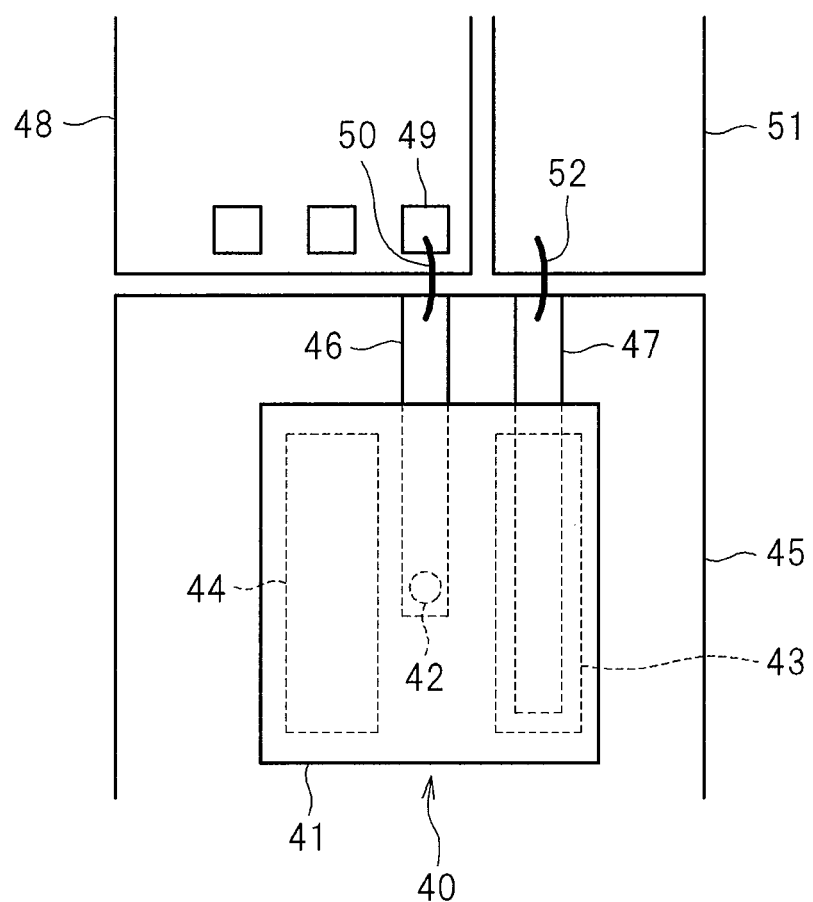
FIG. 6 is a perspective view of a backside illuminated semiconductor light-receiving device according to a related art.

For example, although the example where the sub mesa portions are formed of the P-type electrode mesa portion 8 and the dummy electrode mesa portion 10 is explained in the above-mentioned embodiment, as shown in FIG. 5A to FIG. 5C, the sub mesa portion may be formed of only the dummy electrode mesa portion. That is, as shown in FIG. 5A, in place of the P-type electrode mesa portion 8 shown in FIG. 1, a dummy electrode mesa portion 10A (and a dummy electrode 6A) may be formed. Further, as shown in FIG. 5B, dummy electrode mesa portions 10B-1 to 10B-3 (and dummy electrodes 6B-1 to 6B-3) may be formed respectively on three corner portions excluding a corner portion where the N-type electrode mesa portion 9 which constitutes the main mesa portion is formed. Further, as shown in FIG. 5C, in a hook-shaped region including three corner portions while excluding the corner portion where the N-type electrode mesa portion 9 which constitutes the main mesa portion is formed, one dummy electrode mesa portion 100 (and a dummy electrode 6C) which has a shape corresponding to a shape of the hook-shaped region may be formed.

Further, in the above-mentioned embodiment, although the explanation has been made with respect to the optical receiver module which is mounted in the optical receiver which transmits a signal at a transmission speed of 44.6 Gbps, that is, at a transmission speed of 40 Gbps band, it is needless to say that the transmission speed is not limited to the 40 Gbps band. Further, a transmission code system is not necessarily limited. Resistance or impedance may be further connected to the carrier.

Further, the present invention is also applicable to an optical transceiver provided with an optical transmitter module and an optical receiver module.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A backside illuminated semiconductor light-receiving device comprising:
   a rectangular semiconductor substrate;
   a mesa-shaped light receiving portion having a PN junction portion which receives light incident from a back surface of the semiconductor substrate, the light receiving portion being formed on a center portion of one side on a front surface of the semiconductor substrate and at a position where a distance from the one side to the light receiving portion is set shorter than ½ of a length of two other sides adjacent to the one side;

an electrode of a first conductive type which is formed on an upper surface of the light receiving portion and is conductive with one side of the PN junction portion;

a main mesa portion which is formed on one corner portion of the one side on the front surface of the semiconductor substrate, and has an upper surface wider than the upper surface of the light receiving portion;

an electrode of a second conductive type which is pulled out to the upper surface of the main mesa portion and is conductive with the other side of the PN junction portion;

one or a plurality of sub mesa portions which are formed in a region which includes three other corner portions on the front surface of the semiconductor substrate and have upper surfaces wider than the upper surface of the light receiving portion; and an electrode formed on the upper surface of each sub mesa portion.

2. The backside illuminated semiconductor light-receiving device according to claim 1, wherein a distance from the center of the light receiving portion to the one side is set to 0.1 mm or less.

3. The backside illuminated semiconductor light-receiving device according to claim 1, wherein a height of the main mesa portion and a height of the sub mesa portions are set higher than a height of the light receiving portion.

4. The backside illuminated semiconductor light-receiving device according to claim 1, wherein in a state where the plurality of sub mesa portions are formed in the region which includes the three other corner portions on the front surface of the semiconductor substrate, one of the plurality of sub mesa portions is formed on the other corner portion of the one side on the front surface of the semiconductor substrate, the electrode of the first conductive type is pulled out to the upper surface of the sub mesa portion, and a dummy electrode which is insulated from the PN junction portion is formed on the upper surface of other sub mesa portions of the plurality of sub mesa portions.

5. An optical receiver module which incorporates the backside illuminated semiconductor light-receiving device according to claim 1 therein.

6. The optical receiver module according to claim 5, further comprising:

a pre-amplifier which amplifies an electric signal output of the backside illuminated semiconductor light-receiving device; and a holding member on which a signal-voltage line to which the electrode of the first conductive type is connected, a bias-voltage line to which the electrode of the second conductive type is connected and a line to which the electrode formed on the upper surface of the sub mesa portion is connected are formed, the holding member holding the backside illuminated semiconductor light-receiving device by attaching a front surface side of the backside illuminated semiconductor light-receiving device, wherein an upper surface of the holding member is positioned in the vicinity of the pre-amplifier, the upper surface of the holding member and an upper surface of the pre-amplifier are substantially equal to each other in height, and a portion of the signal-voltage line which extends to the upper surface of the holding member is connected to a signal-voltage terminal formed on the upper surface of the pre-amplifier through a conductive wire.

7. The optical receiver module according to claim 6, wherein a length of a connection line from the center of the light receiving portion to the signal-voltage terminal is set to 1 mm or less.

8. An optical transceiver provided with the optical receiver module according to claim 5.

* * * * *